United States Patent
Aigner et al.

(10) Patent No.: US 7,365,619 B2
(45) Date of Patent: Apr. 29, 2008

(54) BAW APPARATUS

(75) Inventors: Robert Aigner, Unterhaching (DE); Martin Handtmann, Munich (DE)

(73) Assignee: Infineon Technologies AG, Munich (DE)

( * ) Notice: Subject to any disclaimer, the term of this patent is extended or adjusted under 35 U.S.C. 154(b) by 168 days.

(21) Appl. No.: 11/174,446

(22) Filed: Jul. 1, 2005

(65) Prior Publication Data

US 2006/0290446 A1 Dec. 28, 2006

(30) Foreign Application Priority Data

Jun. 22, 2005 (DE) ............... 10 2005 028 927

(51) Int. Cl.
*H03H 9/54* (2006.01)
*H03H 9/70* (2006.01)

(52) U.S. Cl. ................... 333/189; 333/133

(58) Field of Classification Search ........... 333/189
See application file for complete search history.

(56) References Cited

U.S. PATENT DOCUMENTS

| | | | | | |
|---|---|---|---|---|---|
| 3,624,564 | A | * | 11/1971 | Ise et al. | 333/189 |
| 4,344,010 | A | | 8/1982 | Vig et al. | |
| 4,633,204 | A | * | 12/1986 | Gounji et al. | 333/186 |
| 4,900,970 | A | * | 2/1990 | Ando et al. | 310/320 |
| 4,939,403 | A | * | 7/1990 | Kittaka et al. | 310/320 |
| 5,231,327 | A | | 7/1993 | Ketcham | |
| 5,294,862 | A | * | 3/1994 | Banno et al. | 310/366 |
| 5,351,021 | A | * | 9/1994 | Masaie et al. | 333/189 |
| 5,574,414 | A | * | 11/1996 | Ogawa et al. | 333/189 |
| 6,232,698 | B1 | * | 5/2001 | Kaida et al. | 310/320 |
| 6,437,484 | B1 | * | 8/2002 | Nishimura et al. | 310/324 |
| 6,670,866 | B2 | * | 12/2003 | Ella et al. | 333/133 |
| 6,744,184 | B2 | * | 6/2004 | Funaki | 310/366 |
| 2003/0128081 | A1 | | 7/2003 | Ella et al. | |
| 2005/0093657 | A1 | * | 5/2005 | Larson et al. | 333/191 |
| 2005/0140466 | A1 | * | 6/2005 | Larson et al. | 333/187 |

FOREIGN PATENT DOCUMENTS

| | | |
|---|---|---|
| EP | 1 528 675 A1 | 5/2005 |
| EP | 1 528 676 A1 | 5/2005 |
| WO | WO 01/65689 A1 | 9/2001 |

OTHER PUBLICATIONS

Nosek, Jaroslav. "Drive Level Dependence of the Resonant Frequency in BAW Quartz Resonators and His Modeling." *IEEE Transactions of Ultrasonics, Ferroelectrics, and Frequency Control.* vol. 46, No. 4. Jul. 1999. pp. 823-829. (7 Pages).

Ruby, R. et al. PCS 1900 MHz duplexer using thin film bulk acoustic resonators (FBARs). *Electronics Letters.* vol. 35, No. 10. May 1999. (2 Pages).

* cited by examiner

*Primary Examiner*—Barbara Summons
(74) *Attorney, Agent, or Firm*—Maginot, Moore & Beck

(57) ABSTRACT

A description is given of a BAW apparatus having a first BAW resonator and a second BAW resonator which are connected antiparallel to one another so as to reduce non-linear effects, in particular harmonics.

20 Claims, 2 Drawing Sheets

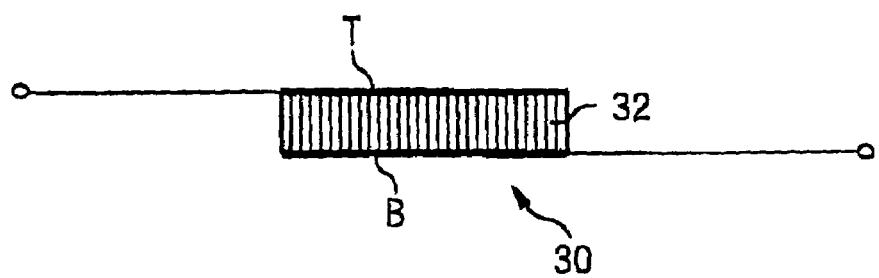
(Prior Art)
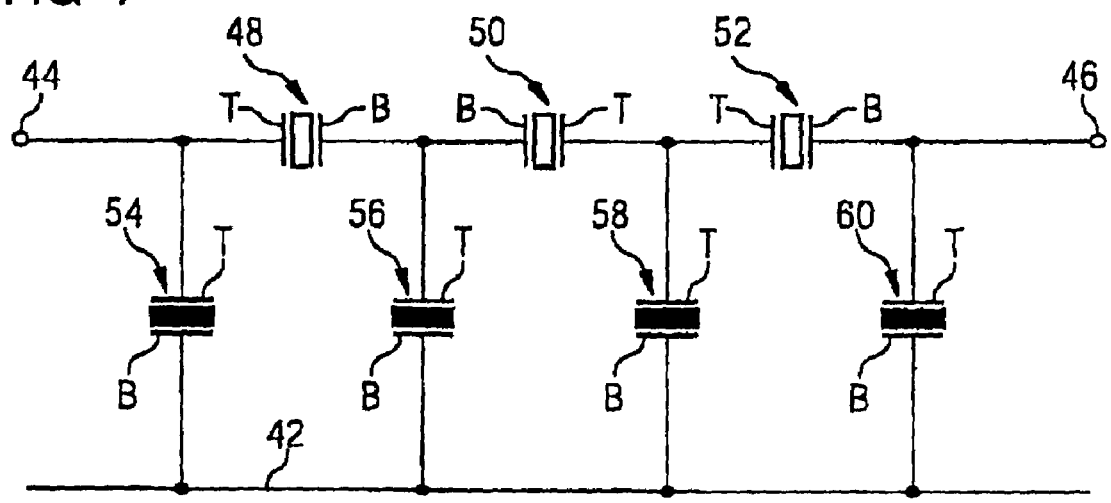
(Prior Art)

BAW APPARATUS

BACKGROUND OF THE INVENTION

1. Field of the Invention

The present invention relates to a BAW (bulk acoustic wave) apparatus, such as a BAW filter.

2. Description of Prior Art

Due to their high resonance frequencies and their high quality, in particular in mobile radio communication, BAW resonators have been widely used. The simplest implementation of a BAW resonator comprises a thin layer of piezoelectric material arranged between two metal electrodes. Common piezoelectric materials are, for example, aluminum nitride (AlN) or zinc oxide (ZnO). FIG. 3 shows an exemplary BAW resonator 30 having a static capacitance C which comprises a layer of piezoelectric material which will be referred to as piezo layer 32 below and is located between a first electrode, or top electrode T, and a second electrode, or bottom electrode B. The designations top electrode and bottom electrode merely serve definition purposes and do not represent any limitation with regard to the spatial arrangement and positioning of the BAW resonator. Rather, the designations top electrode and bottom electrode serve to define the positions of these electrodes in relation to a polarization of the piezoelectric material, as will be explained below, so that the polarization of the respective BAW resonators can be derived from an equivalent circuit diagram designating the T and B electrodes.

If an electric field is applied between first electrode T and second electrode B of BAW resonator 30, the reciprocal or inverse piezoelectric effect will cause BAW resonator 30 to mechanically expand or contract, the case of expansion or of contraction depending on the polarization of the piezoelectric material, as has been mentioned above. This means that the opposite case applies if the electric field is inversely applied between the T and B electrodes. In the case of an alternating field, an acoustic wave is generated in piezo layer 32, and, depending on the implementation of the BAW resonator, this wave will propagate, for example, in parallel with the electric field, as a longitudinal wave, or, as a transversal wave, transverse to the electric field, and will be reflected, for example, at the interface of piezo layer 32. Whenever the thickness d of piezo layer 32 equals an integer multiple of half the wavelength $\lambda$ of the acoustic waves, resonance states and/or acoustic resonance vibrations will occur. The fundamental resonance frequency, i.e. the lowest resonance frequency $f_{res}$, will then be inversely proportional to thickness d of piezo layer 32. This means that the BAW resonator vibrates at the frequency specified externally.

The piezoelectric properties and, thus, also the resonance properties of a BAW resonator depend on various factors, e.g. on the piezoelectric material, the production method, the polarization impressed upon the BAW resonator during manufacturing, and the size of the crystals. As has been mentioned above, it is particularly the resonance frequency which depends on thickness d of the piezo layer.

As has been mentioned above, BAW resonators exhibit electric polarization. The direction of mechanical deformation, expansion or contraction, of the BAW resonator depends on the direction of the electric field applied to first electrode T and second electrode B and on the direction of polarization of BAW resonator 30. For example, if the polarization of the BAW resonator and the direction of the electric field are pointing in the same direction, BAW resonator 30 contracts, whereas BAW resonator 30 expands when the polarization of BAW resonator 30 and the direction of the electric field are pointing in the opposite direction.

BAW resonators have been known in various configurations. Typically, one differentiates between so-called FBARs (film bulk acoustic resonators) and SMRs (solidly mounted resonators). In addition, technology has known not only of BAW resonators having one piezo layer 32, but also of BAW resonators having several piezo layers.

BAW resonators are employed for filters, for example. FIG. 4 shows a circuit diagram of a possible BAW filter in a ladder configuration, comprising electric ground 42, a signal input 44, a signal output 46, a first series resonator 48, a second series resonator 50, a third series resonator 52, a first shunt resonator 54, a second shunt resonator 56, a third shunt resonator 58 and a fourth shunt resonator 60, the series resonators 48, 50, 52 being connected in series between signal input 44 and signal output 46, and the first shunt resonator 54 being connected in parallel between signal input 44 and electrical ground 42, the second shunt resonator being connected between a connection node between first series resonator 48 and second series resonator 50 and electrical ground 42, third shunt resonator 58 being connected between a connection node between second series resonator 50 and third series resonator 52 and the electrical ground, and fourth shunt resonator 60 being connected in parallel between signal output 46 and electrical ground 42. Each of the series and shunt resonators comprises a top electrode T and a bottom electrode B, which are indicated in the equivalent circuit diagram of FIG. 4 so as to indicate the polarization of the BAW resonators.

A problem with, e.g., filter circuits is the thermal stress of the BAW resonators. However, this problem may be solved, for example, by the method of "cascading" of BAW resonators, which is widely utilized with BAW devices. In the following, cascade is to mean a chain, or series connection of elements. A BAW resonator exhibiting static capacitance C is replaced by a cascade of two BAW resonators, each exhibiting a static capacitance 2C, so that the total capacitance is again C. In principle, such a cascaded BAW resonator has the same impedance properties as a corresponding individual BAW resonator. The main motivation for cascading is, as has been mentioned above, to reduce thermal stress of BAW resonators by a factor of 4, the reduction of the thermal stress resulting from the fact that a cascaded pair of BAW resonators exhibiting static capacitance 2C is larger, by a factor of 4, than a corresponding individual BAW resonator exhibiting static capacitance C.

US 005231327 A describes, for example, such an approach for cascading, wherein a BAW resonator exhibiting static capacitance C is replaced by a series connection of two BAW resonators exhibiting static capacitance 2C, these two BAW resonators sharing one piezo layer.

Another problem is that BAW devices, e.g. BAW resonators, BAW filters, or BAW antenna duplexers, which are operated directly at the antenna of a mobile radio system, exhibit a non-linear behavior. This problem occurs, for example, with BAW antenna duplexers if the transmitting power levels exceed 0.1 W.

A side effect of the above-mentioned cascading is that the energy density is also smaller by a factor of 4, and that, thus, non-linear effects are reduced by 6 dB with a cascaded resonator.

However, a major disadvantage of cascading is that cascading considerably increases the size of the BAW device if it is carried out for all BAW resonators of a filter. It is generally impossible to utilize cascading for all resonator branches of a filter; usually cascading is applied only to the smallest BAW resonators in the direct signal path, e.g. to series resonators 48, 50, 52 in a filter having a ladder configuration in accordance with FIG. 4, since these BAW resonators are most affect by the risk of overheating.

SUMMARY OF THE INVENTION

It is object of the present invention to provide a BAW apparatus which will make it possible to reduce the non-linear properties of BAW resonators without considerably increasing the dimensions of the BAW resonator.

The invention provides a BAW apparatus having a first BAW resonator and a second BAW resonator connected antiparallel to each other.

The present invention is based on the observation that the principal effects in the non-linear behavior are the generation of a pronounced second harmonic in the output spectrum of the BAW antenna duplexer, as well as intermodulation effects. The main reason for the non-linearity is the very high energy density which is found, at these power levels, in all active layers of the BAW device, so that the piezo effect itself no longer follows a purely linear relationship between the deformation and/or stress and the electric field.

In addition, the present invention is based on the findings that the harmonic waves of the two BAW resonators mutually reduce one other and, in the ideal case, with appropriate dimensioning, cancel one other out because of the antiparallel connection, i.e. their parallel connection with mutually inverse polarization, and because of the resulting reversal of the signs of the voltages supplied and/or the resulting phase shifts between the voltages applied, so that non-linear effects are reduced and/or eliminated.

To put it more precisely, the present invention allows for the fact that with small voltages and/or electric fields, a deformation of the BAW resonator is proportional to the electric field generating the deformation, and vice versa. For larger voltages and/or electric fields, the ratio of the electric field to the deformation created by it, however, is no longer proportional, i.e. it becomes non-linear. Taking said fact into account, the following observations and considerations have led to the present invention.

Initially, the invention is based on the novel observation that the main mechanism causing the deviation of the BAW resonator from the linear behavior is the shift of the resonance frequency in the presence of a bias stress and/or an additional stress. This bias stress may be mechanical or electrical, and causes stress stiffening. Said stress stiffening cannot be described by linear piezo equations.

The bias stress may be caused, for example, by mechanical pressure acting on the piezo layer, but also by high voltages, in particular by high direct voltages, applied across the piezo layer. It has been proven that the resonance frequency changes upward and downward in an almost linear manner, while the direct voltage varies, or is swept, within a wide range from high negative voltages to high positive voltages. This effect is referred to as VCF effect (VCF=voltages coefficient of frequency). With regard to the direction of the shift, the shifting of the resonance frequency of the BAW resonator is dependent, for example, on the sign of the direct voltage, and with regard to the amount of shift, it is dependent on the amount of voltage. The values for the change in frequency, which have been measured to be 2 gigahertz for the BAW resonators based on aluminum nitride, were in a range of 20 ppm/V, for example. This stress stiffening now becomes relevant for high amplitudes of high-frequency signals, and generates a large proportion and/or sound at double the frequency of the exciter signal and/or input signal. High-frequency measurements performed on the same above-mentioned BAW resonators showed that the power reflected comprised a second harmonic which was in a range of −10 dBm at a fundamental wave of +30 dBm.

On the basis of these results, a simulation model has been realized which takes into account the VCF effect, with the result that the VCF effect dominates, or decisively influences, the non-linear behavior of the BAW resonators, and is key to improved performance. Since the VCF effect may be inverted by changing the sign of the voltage applied, it is also possible to compensate for the impact of the VCF effect on a resonator by subdividing same into two areas of equal sizes and by operating these areas at an inverted phase, specifically by subdividing a BAW resonator exhibiting static capacitance C into two areas, both areas exhibiting static capacitance of C/2, and by operating and/or connecting the two areas in an antiparallel configuration, so that they behave like a BAW resonator exhibiting static capacitance C, which, however, exhibits a considerably reduced non-linearity, since the VCF effect of the two areas is eliminated. The harmonics of the inventive BAW apparatus and/or of the two BAW resonators connected antiparallel are superimposed on one another, attenuate one another and eliminate one another with appropriate dimensioning.

Thus, BAW apparatus are provided, in accordance with the invention, comprising two BAW resonators in antiparallel connection which exhibit properties which are improved over corresponding conventional BAW resonators, i.e. reduced non-linear properties and/or reduced harmonics.

In accordance with the invention, filter circuits may thus be improved, for example, by using an inventive BAW apparatus instead of a BAW resonator. Preferred embodiments of the present invention comprise two BAW resonators whose resonance frequencies have the same values, and which have an identical VCF, whose resonance frequencies thus experience a shift in the same direction and by the same amount due to the VCF effect. Such a matching ensures that the harmonics of both have the same frequency value.

In addition, a particularly preferred embodiment of the present invention comprises two BAW resonators which not only have the same resonance frequency and the same VCF, but also have the same impedance and, in particular, the same static capacitance, so that the amplitudes of the harmonics of the BAW resonators connected antiparallel are of the same size and so that, thus, the second harmonics eliminate each other.

Thus, inventive embodiments of the BAW apparatus have the major advantage that they improve the linearity of the BAW apparatus and considerably reduce and/or eliminate the generation of harmonics without increasing the spatial requirements placed upon the BAW device.

In contrast to the cascading method, a BAW apparatus increases only slightly the overall range required for a filter. Therefore, this method is highly advantageous for BAW resonator branches, in particular for filters which are too large for cascading.

BRIEF DESCRIPTION OF THE DRAWINGS

Preferred embodiments of the present invention will be explained below in detail with reference to the accompanying figures, wherein:

FIG. 3 shows a diagrammatic cross-section of a BAW resonator;

FIG. 4 shows a block diagram of a common BAW filter in a ladder configuration.

DESCRIPTION OF PREFERRED EMBODIMENTS

Figure 1:
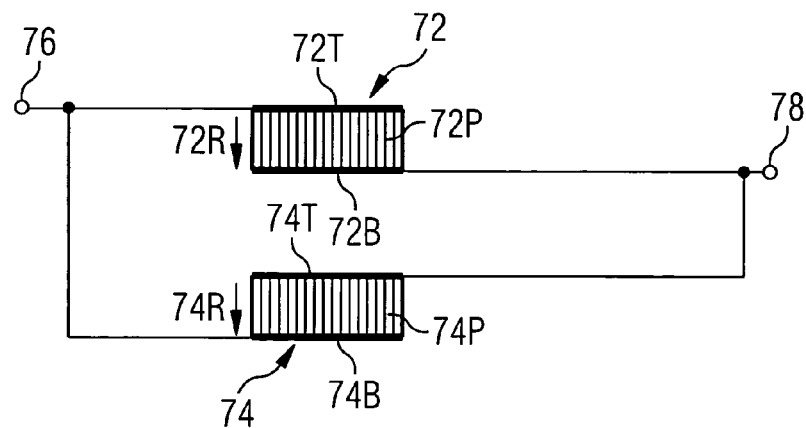
FIG. 1 shows a diagrammatic cross-section of an inventive embodiment.

FIG. 1 shows a diagrammatic cross-section of an inventive embodiment of a BAW apparatus having a first BAW resonator 72, which comprises a piezo layer 72P, a first electrode 72T, and a second electrode 72B, and a second BAW resonator 74 comprising a piezo layer 74P, a first electrode 74T, and a second electrode 74B. The first BAW resonator 72 is polarized, from the first electrode 72T, in the direction of the second electrode 72B, and the second BAW resonator 74 is also polarized from the first electrode 74T in the direction of the second electrode 74B, and the first electrode 72T of the first BAW resonator 72 is electrically connected to the second electrode 74B of the second BAW resonator 74, and to a first electrical terminal 76 of the BAW apparatus, whereas the second electrode 72B of the first BAW resonator 72 is electrically connected to the first electrode 74T of the second BAW resonator 74, and to a second electrical terminal 78 of the BAW apparatus. Arrow 72R points to an exemplary direction of a polarization of the first BAW resonator 72, and arrow 74R points to an exemplary direction of a polarization of the second BAW resonator 74. The only thing that is essential for the inventive BAW apparatus and/or antiparallel connection of the two BAW resonators 72, 74 is that the polarizations 72R, 74R of the two BAW resonators 72, 74 have the same direction with regard to the first electrode 72T, 74T and the second electrode 72B, 74B. Alternatively, for example, the polarization of both BAW resonators 72, 74 may also be pointing in the direction from the second electrode 72B, 74B to the first electrode 72T, 74T.

Thus, the BAW apparatus consists of a BAW resonator pair connected antiparallel.

The first BAW resonator 72 and the second BAW resonator 74 have the same capacitance, e.g. C/2, so that the BAW apparatus overall acts as a BAW resonator exhibiting capacitance C, which, however, comprises considerably reduced non-linear properties and thus improved signal transmission characteristics and/or frequency characteristics compared with a corresponding common BAW resonator exhibiting capacitance C.

As has been described above in the prior art, there are most varied implementations of BAW resonators. For example, BAW resonators 72, 74 alternatively may also comprise several piezo layers, even if FIG. 1 only shows one piezo layer 72P, 74P. In addition, the BAW apparatus may be created by interconnecting two separate and/or individual BAW resonators 72, 74, but alternatively, for example, also by interconnecting two BAW resonators 72, 74 sharing a common piezo layer. Preferably, BAW resonators 72, 74 having the same architecture are used for an inventive BAW apparatus.

Figure 2:
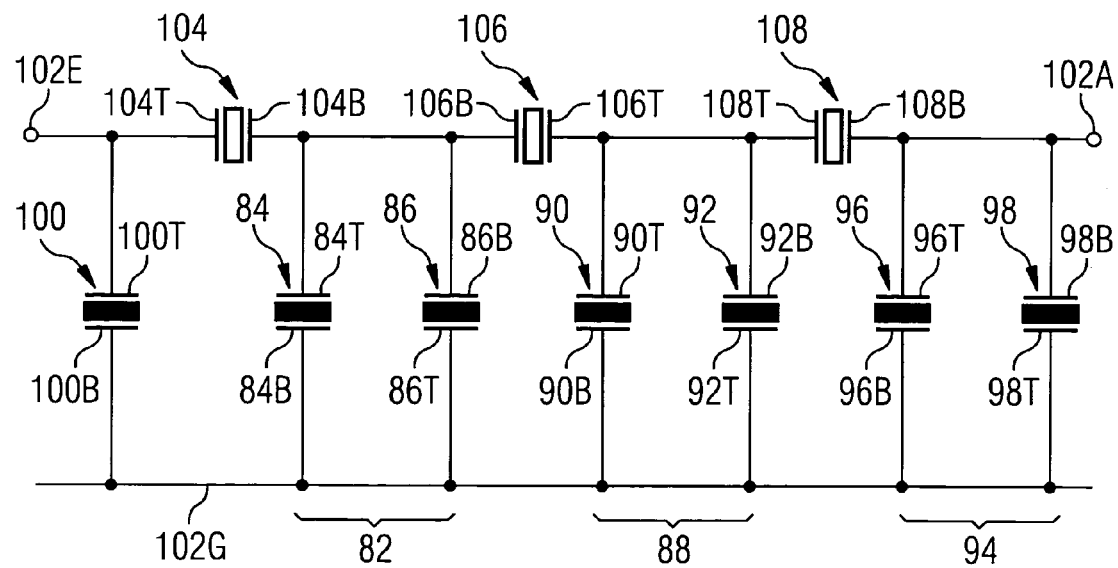
FIG. 2 shows a block diagram of an improved BAW filter in a ladder configuration having three inventive BAW apparatus.

FIG. 2 shows an exemplary circuit diagram of an improved BAW filter having a ladder configuration with three inventive BAW apparatus and/or antiparallel BAW resonator pairs as parallel elements, a first inventive BAW apparatus 82 consisting of a BAW resonator pair 84 and 86 connected antiparallel, a second inventive BAW apparatus 88, consisting of a BAW resonator pair 90, 92 connected antiparallel, and a third inventive BAW apparatus 94, consisting of a BAW resonator pair 96, 98 connected antiparallel. First BAW resonator 84 of first BAW apparatus 82 has a first electrode 84T and a second electrode 84B, second BAW resonator 86 of first BAW apparatus 82 has a first electrode 86T and a second electrode 86B, first BAW resonator 90 of second BAW apparatus 88 has a first electrode 90T and a second electrode 90B, second BAW resonator 92 of second BAW apparatus 88 has a first electrode 92T and a second electrode 92B, first BAW resonator 96 of third BAW apparatus 94 has a first electrode 96T and a second electrode 96B, and second BAW resonator 98 of third BAW apparatus 94 has a first electrode 98T and a second electrode 98B. As a fourth parallel element, FIG. 2 comprises a common BAW resonator 100 having a first electrode 100T and a second electrode 100B. In addition, FIG. 2 comprises three conventional BAW resonators in a series path between a signal input 102E and a signal output 102A, a first series BAW resonator 104 having a first electrode 104T and a second electrode 104B, a second series BAW resonator 106 having a first electrode 106T and a second electrode 106B, and a third series BAW resonator 108 having a first electrode 108T and a second electrode 108B. Both signal input 102E (IN) and signal output 102A (OUT) relate to the common electrical ground 102G (GND). In comparison with FIG. 4, FIG. 2 thus shows an improved BAW filter having a ladder configuration, wherein the parallel resonators 56, 58, 60 in FIG. 4 have been replaced by the inventive BAW apparatus 82, 88, 94 preferably exhibiting the same capacitance. In accordance with the invention, the BAW resonators of the individual BAW apparatus are connected antiparallel, for example first BAW resonator 84 and second BAW resonator 86 of first BAW apparatus 82 are connected antiparallel, which is represented in a circuit diagram, in a pictorial manner, by exchanging first electrode 86T of second BAW resonator 86 against first electrode 84T of first BAW resonator 84 and/or by exchanging second electrode 86B of second BAW resonator 86 against second electrode 84B of first BAW resonator 84. Thus, first electrode 84T, 90T, 96T of first BAW resonator 84, 90, 96 of BAW apparatus 82, 88, 94 is electrically connected to second electrode 86B, 92B, 98B of second BAW resonator 86, 92, 98 of BAW apparatus 82, 88, 94, and vice versa.

Irrespective of the inventive embodiment described in FIG. 4, inventive BAW apparatus may be employed anywhere, and naturally, also on the series path, i.e. instead of series BAW resonators 104, 106, 108.

Alternatively, BAW resonators 72, 74, 104, 106, 108 may also have other capacitances than C/2.

Irrespective of the inventive embodiments presented and/or explained above, the inventive BAW apparatus may be applied, in principle, to all BAW resonator implementations, for example also to BAW resonators having several piezo layers, to BAW resonators of the FBAR or SMR types, to BAW resonators whose polarizations are not aligned in parallel with the electrodes, or both electrodes of which are arranged on the same side of the piezo layer.

Thus, inventive embodiments of the BAW apparatus enable that same are employed, in an efficient and space-saving manner, as BAW resonators, BAW filters or BAW duplexers and/or instead of BAW resonators, for example in filter circuits, duplexer circuits or oscillator circuits, such that their frequency properties are improved and/or their non-linearities are reduced.

In addition, inventive BAW apparatus may comprise not only two BAW resonators, but several BAW resonators connected antiparallel. In summary, it may therefore be stated that inventive BAW apparatus enable non-linear effects, e.g. in BAW filters, to be reduced and/or eliminated by employing in these filters resonator pairs or resonator groups which are connected antiparallel. These resonator pairs or resonator groups connected antiparallel enable considerable reduction of the non-linear effects and/or considerably reduce the generation of harmonics, however without increasing the dimensions of the BAW devices or of the entire filters, or the cost of the BAW devices or of the entire filters.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A BAW filter having a ladder structure, comprising a signal input and a signal output related to a common ground, at least one series resonator or one parallel resonator of the BAW filter being configured as a BAW apparatus, the BAW apparatus comprising:
   a first BAW resonator and a second BAW resonator connected antiparallel,
   wherein the first BAW resonator and the second BAW resonator comprises a common piezo layer, and wherein a first area of the common piezo layer is associated to the first BAW resonator and a second area of the common piezo layer is associated to the second BAW resonator, a polarization of the common piezo layer in the first area and a polarization of the common piezo layer in the second area are unidirectional and the first BAW resonator and the second BAW resonator are electrically operated in inverted phase.

2. The BAW filter as claimed in claim 1, wherein a resonance frequency of the first BAW resonator, and a resonance frequency of the second BAW resonator exhibit substantially identical values.

3. The BAW filter as claimed in claim 2, wherein the resonance frequency of the first BAW resonator, and the resonance frequency of the second BAW resonator exhibit substantially identical shifts in terms of the amount and direction of the resonance frequency due to a Voltages Coefficient of Frequency (VCF) effect.

4. The BAW filter as claimed in claim 1, wherein an impedance of the first BAW resonator, and an impedance of the second BAW resonator are substantially identical.

5. The BAW filter as claimed in claim 1, wherein a capacitance of the first BAW resonator, and a capacitance of the second BAW resonator are substantially identical and comprise a value of C/2, and wherein the BAW apparatus thus exhibits a total capacitance of C.

6. The BAW filter as claimed in claim 1, wherein the first BAW resonator and the second BAW resonator are substantially identical in architecture.

7. The BAW filter as claimed in claim 1, wherein the BAW apparatus is configured as a resonator.

8. The BAW filter as claimed in claim 1, wherein a first electrode of the first BAW resonator is electrically connected to a second electrode of the second BAW resonator and to a first electrical terminal of the BAW apparatus, and a second electrode of the first BAW resonator is electrically connected to a first electrode of the second BAW resonator and to a second electrical terminal of the BAW apparatus, and wherein, the first and second BAW resonators have the same polarizations with regard to their first electrode and their second electrode.

9. The BAW filter as claimed in claim 1, which is implemented as a duplexer.

10. The BAW filter as claimed in claim 1, wherein the BAW apparatus is electrically connected to the ladder structure via a first electrical terminal and a second electrical terminal.

11. A method of reducing the non-linear properties within a BAW apparatus, the method comprising:
   a) providing a first BAW resonator within the BAW apparatus;
   b) providing a second BAW resonator within the BAW apparatus; and
   c) connecting the first BAW resonator to the second BAW resonator in antiparallel.

12. The method of claim 11, wherein a resonance frequency of the first BAW resonator and a resonance frequency of the second BAW resonator exhibit substantially identical values.

13. The method of claim 12, wherein the resonance frequency of the first BAW resonator and the resonance frequency of the second BAW resonator exhibit substantially identical shifts in terms of the amount and direction of the resonance frequency due to a Voltages Coefficient of Frequency (VCF) effect.

14. The method of claim 11, wherein an impedance of the first BAW resonator and an impedance of the second BAW resonator are substantially identical.

15. The method of claim 11, wherein a capacitance of the first BAW resonator and a capacitance of the second BAW resonator are substantially identical and comprise a value of C/2, and wherein the BAW apparatus thus exhibits a total capacitance of C.

16. The method of claim 11, wherein the first BAW resonator and the second BAW resonator are substantially identical in architecture.

17. The method of claim 11, wherein the BAW apparatus is configured as a resonator.

18. The method of claim 11, wherein a first electrode of the first BAW resonator is electrically connected to a second electrode of the second BAW resonator and to a first electrical terminal of the BAW apparatus, and a second electrode of the first BAW resonator is electrically connected to a first electrode of the second BAW resonator and to a second electrical terminal of the BAW apparatus, and wherein the first and second BAW resonators have the same polarizations with regard to their first electrode and their second electrode.

19. The method of claim 11, wherein the BAW apparatus is implemented as a filter.

20. The method of claim 11, wherein the BAW apparatus is implemented as a duplexer.

* * * * *